United States Patent [19]
McClure

[11] Patent Number: 6,059,450
[45] Date of Patent: *May 9, 2000

[54] EDGE TRANSITION DETECTION CIRCUITRY FOR USE WITH TEST MODE OPERATION OF AN INTEGRATED CIRCUIT MEMORY DEVICE

[75] Inventor: David Charles McClure, Carrollton, Tex.

[73] Assignee: STMicroelectronics, Inc., Carrollton, Tex.

[*] Notice: This patent is subject to a terminal disclaimer.

[21] Appl. No.: 08/771,643

[22] Filed: Dec. 21, 1996

[51] Int. Cl.[7] ............................................. G11C 7/00
[52] U.S. Cl. .............................. 371/22.1; 365/201
[58] Field of Search ................... 371/22.1, 21.1, 371/21.4, 22.5, 28, 37.3, 64, 22.35, 27.5; 395/182.03, 183.18, 183.06; 365/201, 206, 233.5, 195, 226, 203, 189.03, 225.6; 324/765; 327/24, 18, 31

[56] References Cited

U.S. PATENT DOCUMENTS

| | | | |
|---|---|---|---|
| 5,381,373 | 1/1995 | Ohsawa | 365/201 |
| 5,408,435 | 4/1995 | McClure | 365/201 |
| 5,455,799 | 10/1995 | McClure et al. | 365/201 |
| 5,493,532 | 2/1996 | McClure | 365/201 |
| 5,596,537 | 1/1997 | Sukegawa et al. | 365/201 |
| 5,619,453 | 4/1997 | Roohparvar et al. | 365/183.33 |
| 5,627,787 | 5/1997 | McClure | 365/201 |
| 5,651,011 | 7/1997 | Keeth | 371/22.1 |
| 5,712,575 | 1/1998 | Ma et al. | 324/763 |

*Primary Examiner*—Robert W. Beausoliel, Jr.
*Assistant Examiner*—Nadeem Iqbal
*Attorney, Agent, or Firm*—Theodore E. Galanthay; Lisa K. Jorgenson; Renee M. Larson

[57] ABSTRACT

An integrated circuit structure and method provides for an integrated circuit device to respond to an edge transition detection (ETD) pulse in one of two ways. First, in response to the ETD pulse, the integrated circuit device exits a test mode at least temporarily every cycle of the integrated circuit device. Second, a node of the integrated circuit device is re-initialized every cycle if it is not forced by a super voltage indicative of test mode entry. Both of these responses prevent accidental entry of the integrated circuit device into the test mode. If the integrated circuit device is supposed to be in the test mode, it stays in the test mode. If, however, the integrated circuit device is not intended to be in the test mode, the ETD pulse forces the integrated circuit device out of the test mode. Subsequent entry into the test mode of the device is permitted if conditions for entry into the test mode have otherwise been met.

55 Claims, 2 Drawing Sheets

EDGE TRANSITION DETECTION CIRCUITRY FOR USE WITH TEST MODE OPERATION OF AN INTEGRATED CIRCUIT MEMORY DEVICE

CROSS-REFERENCE TO RELATED APPLICATIONS

The subject matter of the present application is related to copending United States application, titled "BURN-IN STRESS TEST MODE", Docket Number 96-C-53, filed on Dec. 21, 1996, which is assigned to the assignee hereof, and which is herein incorporated by reference.

BACKGROUND OF THE INVENTION

1. Technical Field

The present invention relates generally to Integrated Circuit (IC) memory devices and more specifically to entry of an integrated circuit memory device into a test mode.

2. Discussion of the Prior Art

Integrated circuit memory devices are routinely subjected to myriad types of test modes. These test modes may be used to subject the integrated circuit device to functional testing, to burn-in testing, and to stress testing, to name just a few examples of testing.

A major concern with integrated circuit devices capable of entering a test mode to be tested is accidental entry into the test mode when the device is not to be tested. Such false entry of an integrated circuit memory device into a test mode is typically caused by a voltage spiking condition of a voltage supplied to the integrated circuit memory device. False entry is exacerbated when the integrated circuit is placed in a noisy environment.

There is thus a need in the art to prevent false entry of an integrated circuit device into a test mode when the device is not to be tested. Any means for preventing false entry of the device into the test mode should protect the device while in a noisy environment in which the device may be subjected to a voltage spiking condition of a supply voltage.

SUMMARY OF THE INVENTION

It is an object of the invention to prevent false entry of an integrated circuit device into a test mode when the device is not intended to be in the test mode.

It is further an object of the invention to prevent false entry of an integrated circuit device into a test mode when the device is subjected to a voltage spiking condition of a supply voltage.

In accordance with the present invention, an integrated circuit structure and method provides for the integrated circuit device to respond to an edge transition detection (ETD) pulse in one of two ways. First, in response to the ETD pulse, the integrated circuit device exits a test mode at least temporarily every cycle of the integrated circuit device. Second, a node of the integrated circuit device is reinitialized every cycle if it is not forced by a super voltage indicative of test mode entry. Both of these responses prevent accidental entry of the integrated circuit device into the test mode. If the integrated circuit device is supposed to be in the test mode, it stays in the test mode. If, however, the integrated circuit device is not intended to be in the test mode, the ETD pulse forces the integrated circuit device out of the test mode. Subsequent entry into the test mode of the device is permitted if conditions for entry into the test mode have otherwise been met. The ETD pulse creates a DC current path that exists only for the duration of the ETD pulse and therefore current dissipation of the integrated circuit device is minimized.

The integrated circuit structure has a node that the ETD pulse initializes every cycle of the integrated circuit device. The ETD pulse is triggered by a change in the state of an address pin or other control pin of the integrated circuit device. According to a first embodiment of the invention, the ETD pulse controls an ETD transistor connected to a node of the integrated circuit device. The node is controlled by a diode stack having one or more diodes or by the ETD transistor. The node is capable of being quickly discharged to protect against Vcc noise spikes that can trigger false entry into a test mode.

According to a second embodiment of the invention, the ETD pulse controls the gates of one or more ETD transistors, with each ETD transistor being connected to a bipolar transistor. Each ETD transistor operates to ensure that the emitter of the bipolar transistor to which it is connected is Vbe volts lower than the base voltage Vb of the bipolar transistor in order to counter leakage between the collector and the emitter of the bipolar transistor. The ETD transistor is capable of quickly discharging the node to protect against Vcc noise spikes that can trigger false entry into a test mode.

BRIEF DESCRIPTION OF THE DRAWINGS

The novel features believed characteristic of the invention are set forth in the claims. The invention itself, however, as well as a preferred mode of use, and further objects and advantages thereof, will best be understood by reference to the following detailed description of an illustrative embodiment when read in conjunction with the accompanying drawings, wherein:

DESCRIPTION OF THE INVENTION

The present invention provides a burn-in stress test mode that is capable of disabling a time-out feature of an IC memory device during a stress test mode of the device in order to facilitate stress testing of the device in a burn-in oven in a timely and economical manner. The time-out feature of an IC memory device is disabled during the burn-in stress test mode by leaving on the wordlines of the device for the duration of the memory cycle for maximum burn-in efficiency.

A major concern of the present invention is the ability to enter into the burn-in stress test mode at the package level of the device. In many IC memory devices there may be no pins available which may be dedicated to enable or enter the burn-in stress test mode. On an asynchronous memory device, for instance, any pin sequence or combination of pin sequences may be needed for device operation and thus the use of device pins to enter the burn-in stress test mode is not a feasible solution. In addition to the dearth of device pins with which to enter the burn-in stress test mode, the use of a greatly elevated voltage such as 15 volts for a CMOS (complementary metal oxide silicon) device on the device pin is likewise an unworkable solution in light of the fact that burn-in ovens do not accommodate the use of greatly elevated voltage levels.

Operating conditions for the normal operating mode and the burn-in operating mode of an integrated circuit memory device differ with respect to voltage levels and temperature ranges. The temperature of an integrated circuit device tracks changes in operating voltage of the device. Consider again the case of a 1 Meg SRAM memory device. The 1 Meg SRAM memory device has a normal operating range of approximately 2.7 volts to 3.6 volts at a maximum temperature of approximately 85 degrees Celsius. Burn-in of the integrated circuit memory device occurs at significantly higher voltage and temperature conditions in order to accelerate weak bit failures and infant life failures. Thus burn-in of the 1 Meg SRAM device during the burn-in operating mode may occur at 6 volts and 125 degrees Celsius.

The differences in voltage operating conditions between normal operation and burn-in operation are used by the present invention to accomplish entry into the burn-in stress test mode only during the elevated voltage condition consistent with burn-in operation. Entry into the burn-in stress test mode is accomplished internally to the memory device upon sensing the elevated voltage and/or temperature condition characteristic of burn-in operation. Thus, no external control through the device pins is required for entry into the burn-in stress test mode.

Figure 1:
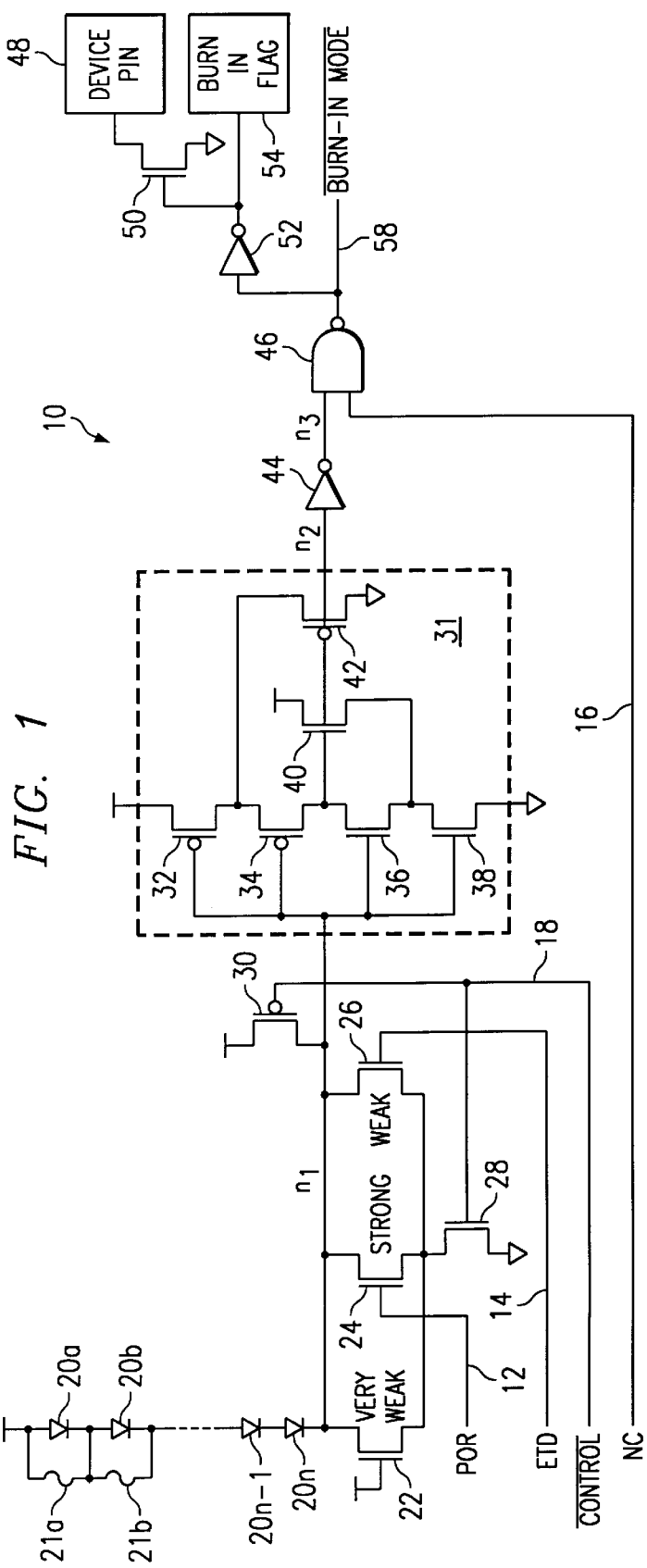
FIG. 1 is a burn-in stress test mode circuit, according to the present invention.

Referring to FIG. 1, burn-in stress test mode circuit 10 detects when supply voltage Vcc to the device exceeds a predetermined voltage level and accommodates entry into the stress test mode when the predetermined voltage level is exceeded. Circuit 10 has n number of diodes 20 $a$ ... 20$n$; fuses 21$a$, 21$b$; n-channel MOS transistors 22, 24, 26, 28, 36, 38, 40, and 50; p-channel MOS transistors 30, 32, 34, and 42; inverter 44; logic element NAND gate 46; and burn-in flag 54. Transistors 32, 34, 36, 38, 40, and 42 form Schmitt trigger 31. Power-On Reset (POR) signal 12, ETD (Edge Transition Detection) signal 14, No Connect signal (NC) 16 attached to a No Connect pin not shown, and Control bar signal 18 are supplied to circuit 10. Circuit 10 generates Burn-In Mode bar signal 58. Burn In Flag 54 indicates when the IC device is in the burn-in mode; alternately, a weak transistor 50 is connected to an input or an output Device Pin 48 through which the device may be monitored to determine if it is in the burn-in test mode.

Node n1 is formed by the electrical connection of the output of programmable diode stack 20$a$ ... 20$n$, the source/drains of transistors 22, 24, and 30, and the gates of transistors 32, 34, 36, 38 of Schmitt trigger 31 as shown in FIG. 1. It should be noted that while diode stack 20$a$ ... 20$n$ is shown as having a number of diodes, diode stack can be comprised of just one diode or any number of diodes. Transistor 22 is a very weak transistor and thus node n1 is characterized as having a very weak static load on it. Transistor 24 is a strong transistor whose gate is controlled by POR signal 12. Transistor 26 is a weak transistor whose gate is controlled by EDT signal 14.

As mentioned, the gates of the transistors 32, 34, 36, 38 of Schmitt trigger 31 help form node n1. Transistors 32, 34, 36, 38 are serially connected as shown in FIG. 1, with a first source/drain of transistor 32 connected to supply voltage Vcc and a second source/drain of transistor 38 connected to supply voltage Vss. Transistor 40 has a first source/drain connected to supply voltage Vcc and a second source/drain connected to the common node formed by a second source/drain of transistor 36 and a first source/drain of transistor 38. The gate of transistor 40 is connected to a second source/drain of transistor 34, a first source/drain of transistor 36, the gate of transistor 42, and the input terminal of inverter 44 to form node n2. A first source/drain of transistor 42 is connected to a second source/drain of transistor 32 and a second source/drain of transistor 34; a second source/drain of transistor 42 is connected to supply voltage Vss. Node n3 is formed by the output terminal of inverter 44 and a first input terminal of logic element NAND gate 46. A second input terminal of NAND gate 46 is driven by NC signal 16. NAND gate 46 generates Burn-In Mode bar signal 58.

Diode stack 20$a$ ... 20$n$ is made programmable by the presence of fuses 21 which may be connected in parallel with a diode 20 of diode stack 20$a$ ... 20$n$ as shown. Blowing a fuse 21 causes the diode 20 to which the fuse 21 is connected in parallel to be included in the diode stack 20$a$ ... 20$n$, since the diode 20 will no longer be shorted out once the fuse 21 is blown. Thus, in the example shown in FIG. 1, blowing fuse 21$a$ but not blowing fuse 21$b$ would result in diode 20$a$ being included in diode stack 20$a$ ... 20$n$ and diode 20$b$ being excluded from diode stack 20$a$ ... 20$n$. It should be noted that a fuse 21 may or may not be placed in parallel with a diode 20 of diode stack 20$a$ ... 20$n$; as shown in FIG. 1, diodes 20$a$ and 20$b$ have fuses 21$a$ and 21$b$ connected in parallel with them, respectively, while diodes 20$n$-1 and 20$n$ do not have a fuse connected in parallel with them. Thus, the decision of how many of the diodes 20 of diode stack 20$a$ ... 20$n$ should be connected in parallel with a fuse 21 is a function of the level of programmability desired for the diode stack 20$a$ ... 20$n$.

Figure 2:
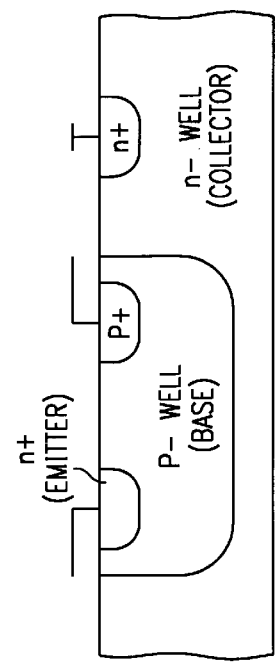
FIG. 2 is a device representation of a diode of a diode stack, according to the present invention.

Upon power-up of the device, POR signal 12 pulses high which forces node n1 to a low state initially. Programmable diode stack 20$a$ ... 20$n$ is connected between node n1 and Vcc as shown. A diode of diode stack 20$a$ ... 20$n$ is an n+ junction in a p-well, assuming an n-substrate n-p-n device of the type shown in FIG. 2. These p-n diodes 20 provide much greater stability over process variations than that which could be afforded by transistors. The diodes of diode stack 20$a$ ... 20$n$ should be laid out remotely from other circuits, be well strapped and employ a guardring/dummy collector structure to prevent device latchup. MOSFET connected diodes could be employed in place of the p-n diodes shown. MOSFET connected diodes, however, may be less desirable than p-n diodes because they vary more over process and temperature than do p-n junction diodes which are more tightly controlled over process and temperature variations.

As supply voltage Vcc rises, node n1 will begin rising once Vcc exceeds the diode forward bias voltage drop. At the burn-in temperature of approximately 125 degrees Celsius, the diode forward bias voltage drop of each diode 20 is approximately 0.3 volts. Assuming that the diode stack 20$a$ ... 20$n$ has thirteen (13) diodes, 20$a$ ... 20$m$, connected in series, node n1 will start to rise at 3.9 volts. It should be noted that by prudently choosing the number of diodes in the diode stack 20$a$ ... 20$n$ no DC (direct current) is consumed at the normal operating range of 3.6 volts or less.

In order to trigger entry of the device into the burn-in stress test mode, supply voltage Vcc must exceed a predetermined voltage level defined as the diode forward bias voltage drop of diode stack 20$a$ ... 20$n$ plus the trip point of Schmitt trigger 31. Thus, assuming that the diode forward bias voltage drop of diode stack 20$a$ ... 20$n$ is approximately 3.9 volts and the trip point of Schmitt trigger 31 is approximately 1.6 volts, Vcc must be greater than 5.5 volts to trigger entry into the burn-in stress test mode. At 5.5 volts, node n2 will go to a low state and node n3 will go to a high state.

Schmitt trigger 31, located between nodes n1 and n2, provides hysteresis and noise immunity as voltage supply Vcc slowly ramps up. The diode forward biased voltage drop associated with each diode 20 increases at lower temperatures at the rate of approximately −2.1 mV per degree Celsius. Thus at the lower temperature of approximately 25 degrees Celsius, the diode forward biased voltage drop is approximately 0.5 volts; compare this with the 0.3 volt drop at 125 degrees Celsius noted above. Schmitt trigger 31 therefore provides immunity against mistakenly entering the burn-in stress test mode under normal operating conditions since, using the example discussed above, Vcc must be 13 times 0.5 volts, or 6.5 volts, before node n1 starts rising.

Control bar signal 18 controls the gate of pull-down transistor 28 and pull-up transistor 30. Control bar signal 18 may be a function of a Chip Enable signal or other suitable control signal of the memory device. Thus, Control bar signal 18 is a low true signal that goes low when in a stress test mode or when the memory device is deselected. During the burn-in stress test mode, Control bar signal 18 goes low to disable the DC (direct current) current path through diode stack 20a . . . 20n, through transistors 22, 24, down through transistor 28 to ground that exists while the device is being stressed at an elevated voltage of 6 volts or more. NC signal 16 is an optional signal that may be used to externally inhibit entry into the burn-in stress test mode if desired. A No Connect pin which provides NC signal 16 may be any device pin specified as a no-connect in the pinout of the datasheet of the device or any device pin which does not have to be exercised. For instance, an output enable (OE) pin of the device could be readily used in place of the No Connect pin. The No Connect pin would recognize the time-out feature of the device, thereby causing the output of NAND gate 46, Burn-In Mode bar signal 58, to ignore the output of Schmitt trigger 31. The signal at node n3 and NC signal 16 are input signals to NAND logic gate 46. If NC signal 16 is a low state, then Burn-in mode bar signal 58 would be forced high, thereby allowing for the time-out circuit of the device to operate so that operational life (op-life) studies of the device may be conducted. Op-life studies predict how long the device may be expected to last in normal operation.

Burn-In Mode bar signal 58 indicates when the device has successfully entered the burn-in stress test mode. The status of Burn-In Mode bar signal 58 may be monitored either through Burn In Flag 54 or through a Device Pin 48. Burn-In Flag 54 is useful in indicating when the device has entered the burn-in stress test mode since it is not readily apparent when the device has or has not timed out. Burn-in flag 54 may be a test pad at wafer level which accommodates testing of the device. Device Pin 48 may be an input pin or an output pin of the device. At the device package level, a weak leakage transistor 50 is connected to Device Pin 48; transistor 50, as a weak leakage transistor, causes approximately 10 to 100 μA of pin leakage. No Connect pin 16 is a package pin of the IC memory device that similarly may be monitored.

Burn-in stress test mode circuit 10 of FIG. 1 has ETD (Edge Transition Detection) capabilities as well. ETD pulse 14 is a high-going pulse that controls the gate of weak n-channel ETD transistor 26 as shown in FIG. 1. ETD pulse 14 initializes node n1 on every pulse and is triggered by a change in state of an address pin or control pin of the IC memory device. ETD pulse 14 resets the integrated circuit device and thus protects against the device accidentally entering the test mode.

The ETD capabilities of FIG. 1 can be used in conjunction with different forms of test mode entry besides the burn-in test mode described above. For instance, the ETD aspect of FIG. 1 can be used for test mode entry that requires that an elevated or "supervoltage" be applied to a pin of the IC memory device. ETD pulse 14 controls weak ETD transistor 26 by controlling its gate. Diode stack 20a . . . 20n is capable of overcoming ETD transistor 26 if the diodes of diode stack 20a . . . 20n are conducting, but weak ETD transistor 26 is capable of discharging node n1 quickly if the diodes of diode stack 20a . . . 20n are not conducting. Thus on every cycle of the IC memory device, node n1 is reinitialized to guard against Vcc noise spikes that can trigger accidental entry into the test mode.

As an example, consider the consequences of a voltage spike without the benefit of ETD pulse 14 controlled weak ETD transistor 26. If supply voltage Vcc were to spike up to 5.5 volts temporarily, then node n1 would correspondingly be pulled-up and then be very slowly discharged by very weak transistor 22. The addition of ETD transistor 26 to the circuitry of FIG. 2 would pull-down node n1 very quickly in response to a voltage spiking condition of Vcc and therefore avoid triggering false entry into the test mode. The ETD transistor 26 compensates for the complicated elevated voltage multiple clocking on a test pin and the numerous registers that would be required to enter into a supervoltage test mode and the various sequences that would be required to exit the supervoltage test mode.

The diodes of diode stack, rather than being capable of overcoming ETD transistor 26, can be sized so that there are incapable of overcoming ETD transistor 26. ETD transistor 26 would not be a weak transistor, so that every cycle the memory device would be at least temporarily taken out of the test mode for the duration of the test mode in order to prevent false triggering, or entry, of the memory device into the test mode. This occurs regardless of whether the memory device is supposed to be in the test mode. After the ETD pulse, the memory device enters the test mode if it is intended to be in the test mode and if the time-out feature of the memory device has not commenced.

Figure 3:
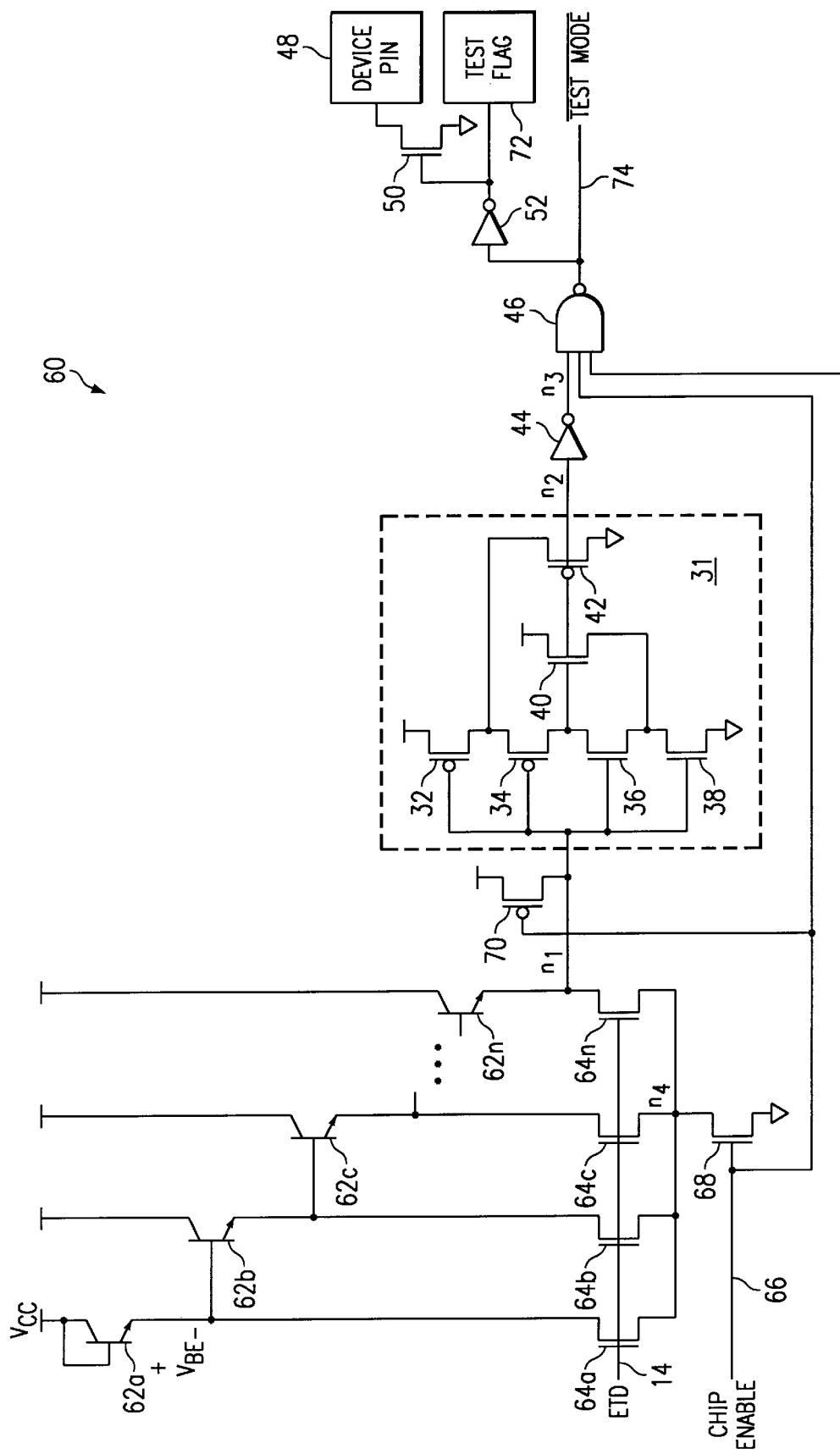
FIG. 3 is an alternate embodiment of stress test mode circuitry, according to the present invention.

Referring to FIG. 3, another implementation of a stress test mode circuit, according to the present invention, is shown. The ETD capability of FIG. 3 again re-initializes node n1 to guard against Vcc noise spikes that can trigger accidental entry into a test mode. The ETD capability of FIG. 3 is capable of being used with any number of different methods of test mode entry in addition to the method described in conjunction with FIGS. 1 and 2. For instance, a memory device requiring an elevated or "supervoltage" on a device pin in order to enter a test mode may use the circuitry of FIG. 3.

Test mode circuit 60 of FIG. 3 has a number of bipolar transistors 62a . . . 62n, ETD transistors 64a . . . 64n, transistor 68, transistor 70, the Schmitt trigger 31 described above and shown in FIG. 1, inverters 44, 52, NAND logic gate 46 that has three input signals rather than two input signals contrary to FIG. 1, transistor 50, output Device Pin 48, and Test Flag 72. Circuit 60 is provided with ETD pulse 14, Control bar signal 18, and No Connect (NC) signal 16 and generates Test Mode bar signal 74. Test Flag 72 indicates when the IC device is in the test mode; alternately, weak transistor 50 is connected to an input or an output Device Pin 48 through which the device may be monitored to determine if it is in the test mode.

The ETD transistors 64a . . . 64n could be replaced with static loads wherein ETD pulse 14 could be tied to supply voltage Vcc. Alternately, a transistor could be placed in parallel with each ETD transistor 64a . . . 64n, wherein each such transistor being placed in parallel with an ETD transistor 64 has its gate controlled by supply voltage Vcc.

In FIG. 3, the diodes of diode stack 20a . . . 20n of FIG. 1 have been replaced with parasitic bipolar transistors 62a . . . 62n. ETD transistors 64a . . . 64n are weak transistors controlled by ETD pulse 14 and operate to ensure that the emitter of each bipolar transistor 62 is Vbe (base-to-emitter voltage) volts lower than its base voltage Vb. The ETD transistors 64a . . . 64n, then, address the case where the bipolar transistors 62a . . . 62n are leaky between collector and emitter and operate to pull up the emitter too close to supply voltage Vcc. Without ETD transistors 64a . . . 64n, the only current drain from the emitter of a bipolar transistor 62 is the very small base current of the next bipolar transistor. ETD transistors 64a . . . 64n also address Vcc noise concerns.

Weak transistors having gates tied to supply voltage Vcc can be placed in parallel with ETD transistors 64a . . . 64n, but this arrangement would provide a current path and therefore standby current introduced by the load of the weak transistors. Inclusion of Control bar signal 18 that is a function of a Chip Enable signal in FIG. 3 provides a distinct advantage in that it eliminates this type of direct current path when the memory device is deselected (Chip Enable signal low).

Control bar signal 18 controls the gate of pull-down transistor 68 and pull-up transistor 70. During a test mode, Control bar signal 18 goes low to disable the DC (direct current) current path through bipolar transistors 62a . . . 62n, ETD transistors 64a . . . 64n, and transistor 68 to ground. Control bar signal 18 is also an input signal to gate 46 that goes high during normal operation of the memory device to inhibit entry into the test mode or to cause the test mode to be exited. Similarly, NC signal 16 is an optional signal that may be used to externally inhibit entry into the burn-in stress test mode if desired or to force the memory device to exit the test mode. An active low signal of either Control bar signal 18 and NC signal 16 will cause the output of NAND gate 46, Test Mode bar signal 74 to ignore the output of Schmitt trigger 31.

Similarly, a p-channel transistor could be placed in series with the collectors of bipolar transistors 62a . . . 62n to power supply Vcc and transistor 70 would be replaced by an n-channel transistor connected between node n1 to ground. The gates of the p-channel transistor and the n-channel transistor would be controlled by Control bar signal 18. The source of the p-channel transistor would be connected to supply voltage Vcc. In this implementation, NAND gate 46 would be a two input gate having only two input signals provided to it: the signal at node n3 and NC signal 16.

While the invention has been particularly shown and described with reference to a preferred embodiment, it will be understood by those skilled in the art that various changes in form and detail may be made therein without departing from the spirit and scope of the invention.

What is claimed is:

1. A method of initializing and verifying a test mode of an integrated circuit device every cycle of the integrated circuit device, comprising the steps of:

initializing a test mode circuit of the integrated circuit device every cycle of the integrated circuit device in response to an edge transition detection (ETD) pulse; and exiting the test mode at least temporarily every cycle of the integrated circuit device.

2. The method of claim 1, wherein causing the integrated circuit device to exit the test mode every cycle of the integrated circuit device prevents accidental entry of the integrated circuit device into the test mode.

3. The method of claim 2, wherein accidental entry of the integrated circuit device into the test mode is caused by noise spikes of a supply voltage of the integrated circuit device.

4. The method of claim 1, wherein the step of initializing the integrated circuit device every cycle resets the test mode circuit of the integrated circuit device every cycle.

5. The method of claim 4, wherein the integrated circuit device is reset by initializing a node of the integrated circuit device every cycle in response to the ETD pulse.

6. The method of claim 1, wherein the ETD pulse is triggered by a change in a state of a pin of the integrated circuit device.

7. The method of claim 6, wherein the pin is an address pin of the integrated circuit device.

8. The method of claim 6, wherein the pin is a control pin of the integrated circuit device.

9. The method of claim 1, wherein entry into the test mode is accomplished by the step of:

applying an elevated voltage to a pin of the integrated circuit device.

10. The method of claim 9, wherein the pin is a supply voltage pin.

11. The method of claim 1, wherein after the step of exiting the test mode at least temporarily every cycle, comprising the further step of:

entering the test mode if the integrated circuit device has not entered a time-out mode of the integrated circuit device and if conditions for entry into the test mode have been met.

12. The method of claim 1, wherein the step of exiting the test mode at least temporarily every cycle of the integrated circuit device causes the test mode to be exited every cycle for a time equal to the duration of the ETD pulse.

13. A method of initializing and verifying a test mode of an integrated circuit device every cycle of the integrated circuit device, comprising the steps of:

initializing a test mode circuit of the integrated circuit device every cycle of the integrated circuit device in response to an edge transition detection (ETD) pulse; and re-initializing a node of the test mode circuit if the node is not forced by an elevated voltage.

14. The method of claim 13, wherein causing the integrated circuit device to exit the test mode every cycle of the integrated circuit device prevents accidental entry of the integrated circuit device into the test mode.

15. The method of claim 14, wherein accidental entry of the integrated circuit device into the test mode is caused by noise spikes of a supply voltage of the integrated circuit device.

16. The method of claim 13, wherein entry into the test mode is accomplished by the step of:

applying an elevated voltage to a pin of the integrated circuit device.

17. The method of claim 16, wherein the pin is a supply voltage pin.

18. A test mode circuit of an integrated circuit device having edge transition detection (ETD) circuitry, comprising:

a diode stack comprised of a plurality of diodes, wherein the plurality of diodes are serially connected with a first diode of the plurality of diodes connected to a first supply voltage;

a first transistor having a gate controlled by an edge transition detection (ETD) pulse and a first source/drain coupled to a second supply voltage; and a first logic element having an input terminal and an output terminal, wherein a node is defined by the electrical connection of the input terminal of the first logic element, a second diode of the plurality of diodes of the diode stack, and a second source/drain of the third transistor;

wherein the integrated circuit device is reset every cycle of the integrated circuit device in response to the ETD pulse, thereby causing the node to be initialized and a test mode to be exited at least temporarily every cycle of the integrated circuit device.

19. The circuit of claim 18, further comprising:
a second transistor having a gate connected to the first supply voltage and a second source/drain connected to the node;
a third transistor having a gate controlled by a power-on reset signal, a first source/drain coupled to the first supply voltage, and a second source/drain connected to the node;
a fourth transistor having a gate controlled by a first control signal, a first source/drain connected to a first source/drain of the third transistor and a first source/drain of the second transistor, and a second source/drain connected to a second supply voltage;
a fifth transistor having a gate controlled by the first control signal and a second source/drain connected to the first supply voltage.

20. The circuit of claim 19, wherein the node further comprises the second source/drain of the fifth transistor.

21. The circuit of claim 19, wherein while in the test mode a control signal disables a DC current path of the integrated circuit device that flows through the diode stack, the first transistor, the second transistor, the third transistor, and the fourth transistor to the second supply voltage.

22. The circuit of claim 18, further comprising:
a second logic element, having a first input terminal connected to the output terminal of the first logic element and having a second input terminal controlled by a second control signal supplied by a pin of the integrated circuit device, wherein the second logic element generates an output signal indicative of whether the integrated circuit device is in the test mode.

23. The circuit of claim 18, wherein the circuit further comprises:
a fuse element connected in parallel to a diode of the plurality of diodes of the diode stack.

24. The circuit of claim 18, wherein the first transistor is a very weak transistor and a second transistor is a strong transistor.

25. The circuit of claim 18, wherein the first logic element is a Schmitt trigger.

26. The circuit of claim 18, wherein the circuit further comprises:
a means which is monitored to determine when the integrated circuit device is in the test mode.

27. The circuit of claim 26, wherein the means which is monitored to determine when the integrated circuit device is in the test mode is; a flag of the integrated circuit device which is monitored.

28. The circuit of claim 27, wherein the flag is a test pad of the integrated circuit device.

29. The circuit of claim 26, wherein the means which is monitored to determine when the integrated circuit device is in the test mode is a pin of the integrated circuit device.

30. The circuit of claim 18, wherein when a temperature of the integrated circuit device exceeds a predetermined temperature level, the integrated circuit device enters the test mode.

31. The method of claim 28, wherein entry into the test mode is inhibited by a logic state of a pin of the integrated circuit device even when the supply voltage exceeds the predetermined voltage level or the temperature of the integrated circuit device exceeds the predetermined temperature level, and
wherein the test mode is exited after it has been entered based on the logic state of the pin even if the supply voltage exceeds the predetermined voltage level or the temperature of the integrated circuit device exceeds the predetermined temperature level.

32. The circuit of claim 18, wherein the diode stack comprises a plurality of p-n junction diodes.

33. The circuit of claim 18, wherein the diode stack comprises a plurality of MOSFET diodes.

34. The circuit of claim 18, wherein entry into the test mode is inhibited by a logic state of a pin of the integrated circuit device even when the supply voltage exceeds the predetermined voltage level, and
wherein the test mode is exited after it has been entered based on the logic state of the pin even if the supply voltage exceeds the predetermined voltage level.

35. The circuit of claim 18, wherein while in the test mode a control signal disables a DC current path of the integrated circuit device.

36. The circuit of claim 29, wherein the DC current path flows through the diode stack, the first transistor, the second transistor, and the third transistor to a second supply voltage.

37. A test mode circuit of an integrated circuit device having edge transition detection (ETD) circuitry, comprising:
a plurality of bipolar transistors, each having a collector connected to a first supply voltage, a base, and an emitter, with the emitter of a first bipolar transistor connected to the base of a second bipolar transistor and the base of the first bipolar transistor connected to the first supply voltage;
a plurality of ETD transistors, each having a first source/drain, a second source/drain, and a gate, with the gate of each ETD transistor being controlled by an ETD pulse and with the first source/drain of a first ETD transistor connected to the emitter of the first bipolar transistor and the first source/drain of a second ETD transistor connected to the emitter of the second bipolar transistor, wherein the first ETD transistor operates to ensure that the emitter of the first bipolar transistor is Vbe (base-to-emitter voltage) volts lower than the Vb (base voltage) of the first bipolar transistor and wherein the second ETD transistor operates to ensure that the emitter of the second bipolar transistor is Vbe (base-to-emitter voltage) volts lower than the Vb (base voltage) of the second bipolar transistor; and
a first logic element having an input terminal and an output terminal, wherein a node is defined by the electrical connection of the input terminal of the first logic element, a second source/drain of the second transistor, the emitter of the second bipolar transistor, and the first source/drain of the second ETD transistor.

38. The circuit of claim 37, further comprising:
a second logic element, having a first input terminal connected to the output terminal of the first logic element and having a second input terminal controlled by a second control signal supplied by a pin of the integrated circuit device, wherein the second logic element generates an output signal indicative of whether the integrated circuit device is in a stress test mode.

39. The circuit of claim 37, further comprising:
- a first transistor having a first source/drain, a second source/drain, and a gate, with the first source/drain connected to the second source/drain of the first ETD transistor and the second source/drain of the second ETD transistor, the second source/drain connected to a second supply voltage, and the gate controlled by a control signal; and
- a second transistor having a first source/drain, a second source/drain, and a gate, with the first source/drain connected to the first supply voltage and the gate controlled by the control signal.

40. The circuit of claim 37, wherein the first logic element is a Schmitt trigger that comprises:
- a first transistor having a first source/drain connected to the first supply voltage and a gate connected to the input terminal of the Schmitt trigger;
- a second transistor having a first source/drain connected to a second source/drain of the first transistor and a gate connected to the input terminal of the Schmitt trigger;
- a third transistor having a first source/drain connected to a second source/drain of the second transistor and a gate connected to the input terminal of the Schmitt trigger;
- an fourth transistor having a first source/drain connected to a second source/drain of the third transistor, a second source/drain connected to the second supply voltage, and a gate connected to the input terminal of the Schmitt trigger;
- a fifth transistor having a gate connected to the second source/drain of the second transistor and the first source/drain of the third transistor, a first source/drain connected to the first supply voltage, and a second source/drain connected to the second source/drain of the third transistor and the first source/drain of the fourth transistor; and
- a sixth transistor having a gate connected to the gate of the fifth transistor, the output terminal of the Schmitt trigger, a first source/drain connected to the second source/drain of the first transistor and the first source/drain of the second transistor, and a second source/drain connected the second supply voltage.

41. The circuit of claim 37, wherein the circuit further comprises:
- a means which is monitored to determine when the integrated circuit device is in a stress test mode.

42. The circuit of claim 41, wherein the means which is monitored to determine when the integrated circuit device is in the stress test mode is a flag of the integrated circuit device which is monitored.

43. The circuit of claim 42, wherein the flag is a test pad of the integrated circuit device.

44. The circuit of claim 41, wherein the means which is monitored to determine when the integrated circuit device is in the stress test mode is a pin of the integrated circuit device.

45. The circuit of claim 44, wherein leakage current of the pin is monitored.

46. The circuit of claim 45, further comprising:
- a p-channel transistor connected in series to the collector of each bipolar transistor and to the first supply voltage.

47. The circuit of claim 37, wherein the test mode circuit of the integrated circuit device is reset every cycle of the integrated circuit device in response to the ETD pulse, thereby causing the node to be initialized and a test mode to be exited at least temporarily every cycle of the integrated circuit device.

48. The circuit of claim 37, wherein in response to the ETD pulse the node is re-initialized every cycle if not being forced by an elevated voltage.

49. The circuit of claim 25, wherein the Schmitt trigger comprises:
- a fourth transistor having a first source/drain connected to the first supply voltage and a gate connected to the input terminal of the Schmitt trigger;
- a fifth transistor having a first source/drain connected to a second source/drain of the fourth transistor and a gate connected to the input terminal of the Schmitt trigger;
- a sixth transistor having a first source/drain connected to a second source/drain of the fifth transistor and a gate connected to the input terminal of the Schmitt trigger;
- an seventh transistor having a first source/drain connected to a second source/drain of the sixth transistor, a second source/drain connected to the second supply voltage, and a gate connected to the input terminal of the Schmitt trigger;
- a eighth transistor having a gate connected to the second source/drain of the fifth transistor and the first source/drain of the sixth transistor, a first source/drain connected to the first supply voltage, and a second source/drain connected to the second source/drain of the sixth transistor and the first source/drain of the seventh transistor; and
- a ninth transistor having a gate connected to the gate of the eighth transistor, the output terminal of the Schmitt trigger, a first source/drain connected to the second source/drain of the fourth transistor and the first source/drain of the fifth transistor, and a second source/drain connected the second supply voltage.

50. A test mode circuit of an integrated circuit device having edge transition detection (ETD) circuitry, comprising:
- a first transistor having a gate controlled by an edge transition detection (ETD) pulse and a first source/drain coupled to a first supply voltage;
- a first logic element, having an input terminal and an output terminal, that is coupled to the first transistor; and
- a circuit coupled to a second supply voltage and coupled to the first transistor and the first logic element at a node defined by a second source/drain of the first transistor and the input terminal of the first logic element that provides a predetermined reference voltage to the node once the second supply voltage exceeds a predetermined voltage level, wherein the predetermined reference voltage tracks variations in the second supply voltage,
- wherein the integrated circuit device is reset every cycle of the integrated circuit device in response to the ETD pulse, thereby causing the node to be initialized and a test mode to be exited at least temporarily every cycle of the integrated circuit device.

51. The test mode circuit of claim 50, wherein the circuit comprises:
- a diode stack comprised of a plurality of serially connected diodes, with a first diode of the plurality of serially connected diodes connected to the second supply voltage,
- wherein the predetermined voltage level is determined by a forward bias voltage drop of the diode stack.

52. The test mode circuit of claim 51, further comprising:
- one or more fuse elements connected in parallel with one or more diodes of the plurality of serially connected diodes.

53. The test mode circuit of claim 50, wherein the circuit comprises:

a plurality of bipolar transistors coupled to the first supply voltage and the second supply voltage.

54. The test mode circuit of claim 53, further comprising:

a plurality of ETD transistor coupled to the plurality of bipolar transistors, with a gate of each ETD transistor controlled by the ETD pulse, a first source/drain of each ETD transistor coupled to a first terminal of a bipolar transistor of the plurality of bipolar transistors to which it is coupled, wherein each ETD transistor operates to ensure that the first terminal of the bipolar transistor to which it is connected has a voltage that is offset from a base voltage of the bipolar transistor by a voltage between the base and the first terminal of the bipolar transistor.

55. The test mode circuit of claim 50, wherein the circuit comprises:

a plurality of bipolar transistors, each having a collector connected to the second supply voltage, a base, and an emitter, with the emitter of a first bipolar transistor connected to the base of a second bipolar transistor and the base of the first bipolar transistor connected to the second supply voltage; and a plurality of ETD transistors, each having a first source/drain, a second source/drain, and a gate, with the gate of each ETD transistor being controlled by an ETD pulse and with the first source/drain of a first ETD transistor connected to the emitter of the first bipolar transistor and the first source/drain of a second ETD transistor connected to the emitter of the second bipolar transistor, wherein the first ETD transistor operates to ensure that the emitter of the first bipolar transistor is Vbe (base-to-emitter voltage) volts lower than the Vb (base voltage) of the first bipolar transistor and wherein the second ETD transistor operates to ensure that the emitter of the second bipolar transistor is Vbe (base-to-emitter voltage) volts lower than the Vb (base voltage) of the second bipolar transistor.

* * * * *